United States Patent [19]

Nishikawa et al.

[11] Patent Number: 4,713,632
[45] Date of Patent: Dec. 15, 1987

[54] BAND REFLECTION TYPE FET DIELECTRIC RESONATOR OSCILLATOR

[75] Inventors: Toshio Nishikawa, Nagaokakyo; Sadahiro Tamura, Kyoto, both of Japan

[73] Assignee: Murata Manufacturing Co., Ltd., Nagaokakyo, Japan

[21] Appl. No.: 863,999

[22] Filed: May 16, 1986

Related U.S. Application Data

[63] Continuation-in-part of Ser. No. 615,537, May 31, 1984, abandoned.

[30] Foreign Application Priority Data

Jun. 3, 1983 [JP] Japan .................. 58-99971

[51] Int. Cl.[4] ............................... H03B 5/18
[52] U.S. Cl. .................... 331/117 D; 331/117 FE
[58] Field of Search ............ 331/117 D, 117 FE, 96, 331/99, 107 SL

[56] References Cited

U.S. PATENT DOCUMENTS

| 4,135,168 | 1/1979 | Wade | 331/117 FE |
| 4,357,582 | 11/1982 | Ishihara et al. | 331/117 D X |
| 4,435,688 | 3/1984 | Shinkawa et al. | 331/117 D X |

FOREIGN PATENT DOCUMENTS 0107611  7/1982  Japan .................. 331/117 D

OTHER PUBLICATIONS

Ishihara et al, IEEE Transactions on Microwave Theory and Techniques, vol. MTT-28, No. 8, Aug. 1980, pp. 817–824.
Mori et al, IEEE International Microwave Symposium Digest, Washington, D.C., May 28-30, 1980, pp. 376–378.
"Transistor Technique", vol. 3, Mar. 1982, Design Techniques in a Recent Ultrahigh Frequency Circuit, pp. 323–335.

Primary Examiner—Siegfried H. Grimm
Attorney, Agent, or Firm—Wenderoth, Lind & Ponack

[57] ABSTRACT

A band reflection type oscillator includes a GaAs-FET having a source, a gate and a drain in which the drain is connected to ground. A stripline is connected to the gate, and a dielectric resonator is provided adjacent the stripline in a magnetically coupled relationship therewith. A stripline stub is electrically connected to the drain and positioned adjacent the resonator in a magnetically coupled relationship therewith, thereby defining a positive feedback circuit through the drain, said stripline stub, the resonator and the stripline to the gate. By the positive feedback circuit, the oscillation stability is improved.

4 Claims, 3 Drawing Figures

BAND REFLECTION TYPE FET DIELECTRIC RESONATOR OSCILLATOR

CROSS REFERENCE TO THE RELATED APPLICATION

This is a continuation-in-part application of now abandoned application Ser. No. 615,537, filed May 31, 1984.

BACKGROUND OF THE INVENTION

1. Field of the invention

The present invention relates to an oscillator and, more particularly, to a ultra-high frequency oscillator (in the gigahertz range), or a microwave oscillator, having a GaAs-FET.

2. Description of the Prior Art

The microwave oscillator having a GaAs-FET is used, for example, in a receiver for satellite broadcasting. The oscillator employing a GaAs-FET can be divided into three types: a source grounded type; a gate grounded type; and a drain grounded type. The present invention is particularly related to the drain grounded type wherein one GaAs-FET is mounted on a dielectric substrate, such as on an aluminium oxide plate, together with a dielectric resonator that operates in the $TE_{01\delta}$ mode. The electric connections on the substrate are effected by suitable striplines.

From another viewpoint, the microwave oscillators are classified into two types: the feedback type; and the negative resistance type, as disclosed in an article of Ishihara et al, IEEE Transactions on Microwave Theory and Techniques, Vol. MTT-28, No. 8, August 1980, pp. 817–824 (331–117D). The negative resistance type, which is also referred to as a band reflection type, takes the advantage in the points that its operation is stable and the structure is simple. The feedback type takes the advantage in the point that the oscillation frequency is stable even when the condition of the load or the power source changes.

The feedback type, however, has a drawback in the point that a strong magnetic coupling between the stripline and the dielectric resonator is required and, therefore, the locations of the striplines and the dielectric resonator must be adjusted at a high accuracy, resulting in a difficulty in the manufacturing process.

The oscillator of the present invention is particularly directed to the band reflection type (negative resistance type). An example of the prior art band reflection type oscillator is shown in FIG. 1. A GaAs-FET 10 has three terminals, gate G, source S and drain D. The drain D is connected to ground through a suitable capacitive element. The source S is connected to a matching circuit 12, and further to an output. The gate G is connected to a resonant circuit 14 defined by a stripline 2, resistor R1 and resonator DR made of a dielectric material. The resonator DR is provided in a magnetically coupled relationship with the stripline 2, thereby determining the oscillation frequency. FET 10 operates in the negative resistance region, wherein the current decreases as the voltage increases. In the circuit of FIG. 1, the feedback for the oscillation is carried out by a capacitance $C_{gs}$ between gate and source, which is internally included in FET 10.

According to the prior art band reflection type oscillator described above, there is a disadvantage in that the oscillation frequency undesirably varies relative to a change in the source voltage or to a change in the condition of a connected load.

SUMMARY OF THE INVENTION

The present invention has been developed with a view to substantially solving the above described disadvantages and has for its essential object to provide an improved band reflection type oscillator which can operate with a high stability even when the condition of the load or the power source changes.

It is also an essential object of the present invention to provide an improved band reflection type oscillator of the above described type which can can be readily manufactured at a low cost.

In accomplishing these and other objects, an oscillator according to the present invention is characterized in that a positive feedback circuit is provided between the drain and gate of the GaAs-FET.

BRIEF DESCRIPTION OF THE DRAWINGS

These and other objects and features of the present invention will become apparent from the following description taken in conjunction with preferred embodiments thereof with reference to the accompanying drawings, throughout which like parts are designated by like reference numerals, and in which.

DESCRIPTION OF THE PREFERRED EMBODIMENTS

Figure 1:
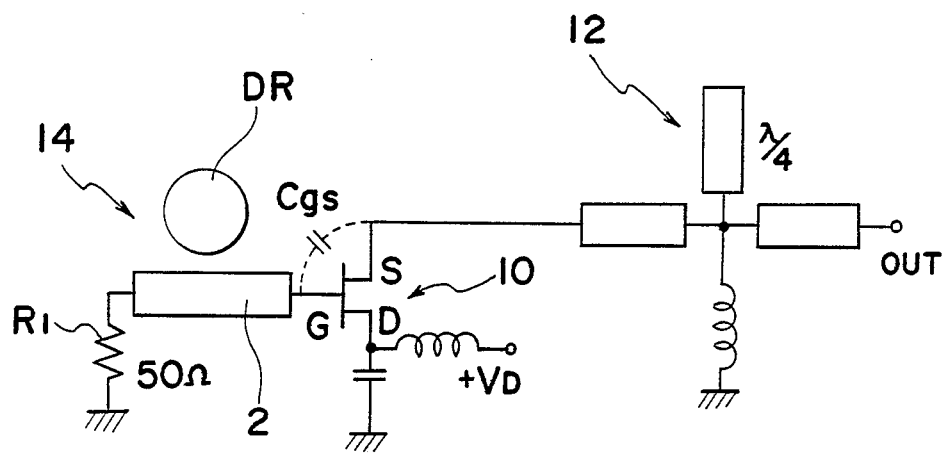
FIG. 1 is a circuit diagram of a band reflection type oscillator according to prior art.
Figure 2:
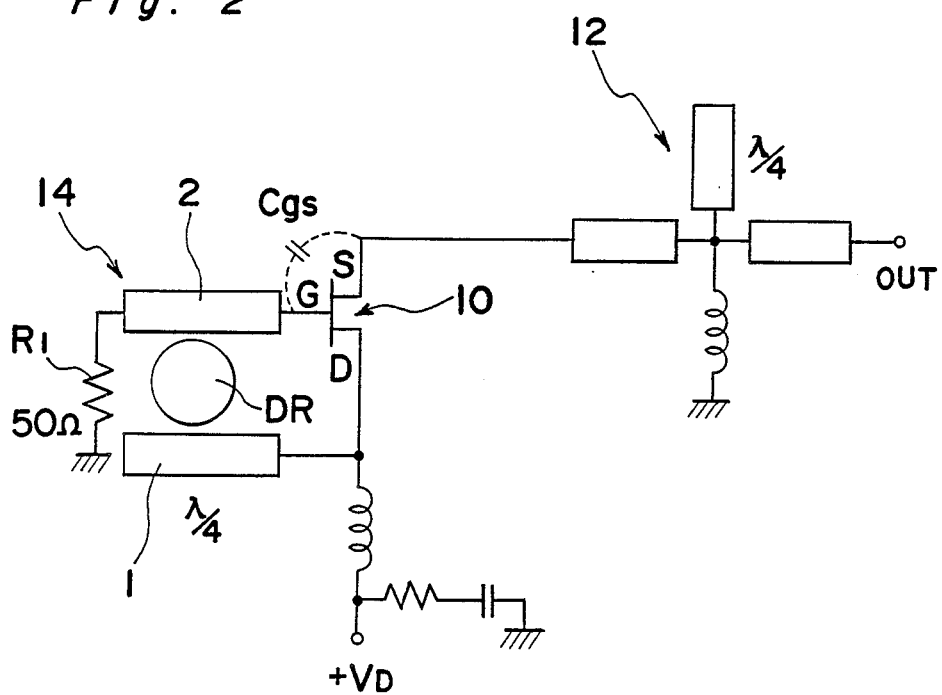
FIG. 2 is a circuit diagram of an improved band reflection type oscillator according to a first embodiment of the present invention.

Referring to FIG. 2, an improved band reflection type oscillator according to a first embodiment of the present invention is shown. The oscillator shown comprises GaAs-FET 10 which has three terminals, gate G, source S and drain D. The source S is connected to a matching circuit 12, and further to an output. Thus, the oscillator of the present invention is a source output type. The gate G is connected to a resonant circuit 14 defined by a stripline 2, resistor R1 and resonator DR made of a dielectric material. The resonator DR is provided adjacent the stripline 2 in a magnetically coupled relationship therewith, thereby determining the oscillation frequency. The stripline 2 is further connected to a resistor R1 having a resistance, such as 50 ohms, and in turn, to ground.

According to the present invention the oscillator further comprises a feedback circuit defined by a stripline stub 1 made of a metal stripline and having a length equal to $(n/2+\frac{1}{4})$ wavelength, wherein n is zero or a positive integer, and preferably a length of $\frac{1}{4}$ wavelength. Stub 1 is electrically connected to the drain D and positioned adjacent the resonator DR in a magnetically coupled relationship therewith, thereby defining a positive feedback circuit. Thus, the feedback signal is transmitted through drain D, stripline stub 1, resonator DR and stripline 2 to gate G. Thus, the oscillation signal in the gigahertz frequency can be stabilized.

The oscillator of the present invention, such as shown in FIG. 2, is the source output type. Also, the oscillator of the present invention is basically the band reflection type (negative resistance type), but at the same time, because the positive feedback circuit defined by drain-stripline 1, resonator DR and stripline 2, is further added, it further functions as the feedback type.

Unlike the typical feedback type oscillator of source output type, the magnetic coupling between stripline 1 and dielectric resonator DR in the oscillator of the present invention is very weak. This can be understood from the structure that, according to the present invention, although stub 1 has a length of ¼ wavelength to effect the grounding of the drain in terms of high frequency, the drain is not 100% grounded due to the electrical influence effected by the line connected to stub 1 and dielectric resonator DR located close to the stub. An equivalent circuit would be such that the drain is connected to ground through a low impedance element. Thus, a weak magnetic coupling is effected between stub 1 and dielectric resonator DR, thereby establishing a weak positive feedback circuit from the drain through resonator DR to the source of the FET. However, in the typical feedback type oscillator of source output type, such as shown in the above-mentioned Ishihara et al article p819, FIG. 3 (c), the signal from the drain of the FET should preferably be totally fed back through the dielectric resonator to the gate thereof, thereby requiring a strong magnetic coupling between the drain and the dielectric resonator. However, according to the present invention, the positioning of the dielectric resonator DR with respect to stripline 1 can be done with less accuracy since such strong coupling is not required.

Figure 3:
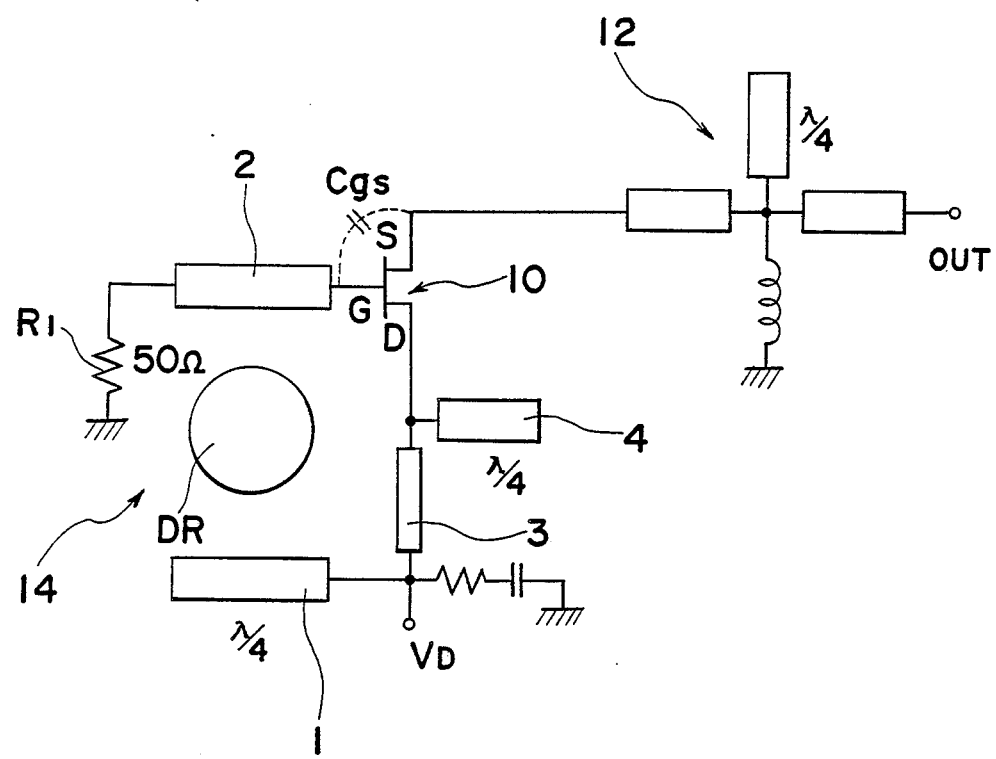
FIG. 3 is a circuit diagram of an improved band reflection type oscillator according to a second embodiment of the present invention.

Referring to FIG. 3, an oscillator according to a second embodiment of the present invention is shown. In comparison with the first embodiment, a high-impedance stripline 3 is connected between drain D and a terminal which is connected to a source of a drain bias voltage $+V_D$. Furthermore, at the end of the stripline 3 close to the drain D, a stripline stub 4 having the same structure as the stripline stub 1 is provided.

In the second embodiment, striplines 1 and 4 serves as capacitance elements, and stripline 3 serve as inductance. Therefore, as to the signal noise sent from the power source, striplines 1, 3 and 4 define a so-called $\pi$ type low pass filter so as to cut off the noise signals from the power source. In other words, the high impedance stripline 3 and stub stripline 4 in FIG. 3 are provided for defining, in combination with stripline 1, a low pass filter for eliminating noise signals.

In either of the embodiments described above, the circuit can be used in a so-called reverse channel type of operation in which the source of drain bias voltage $+V_D$ is changed from positive to negative $-V_D$. In this case, since GaAs-FET has a symmetrical arrangement of source S and drain D about the gate G, the change of bias voltage at the drain D from positive to negative results in a reverse operation such that the source S, which is connected to ground, operates as a drain, and the drain D operates as a source.

According to the band reflection type oscillator of the present invention, since a positive feedback circuit defined by a stripline stub 1 made of a metal stripline having a length of ¼ wavelength and the dielectric resonator DR are used, it has a merit of the feedback type. Thus, the oscillator of the present invention operates with a high stability, without using any stabilizing circuit, even when the condition of the load of the power source changes, and yet resulting in a low manufacturing cost.

Although the present invention has been fully described with reference to several preferred embodiments, many modifications and variations thereof will now be apparent to those skilled in the art, and the scope of the present invention is therefore to be limited not by the details of the preferred embodiments described above, but only by the terms of appended claims.

What is claimed is:

1. A band reflection type oscillator comprising:
   an FET having a source, a gate and a drain;
   a stripline connected to said gate;
   a resonator provided adjacent said stripline in a magnetically coupled relationship therewith; and
   a first stripline stub having a length equal to $(n/2+¼)$ wavelength, wherein n is zero or a positive integer, said stub position adjacent said resonator in a magnetically coupled relationship therewith and having a first end which is connected to said drain and a second end which is open ended, thereby substantially grounding said drain in terms of high frequency and, at the same time, forming a positive feedback circuit between said drain and said gate through said resonator.

2. A band reflection type oscillator as claimed in claim 1, further comprising a high impedance stripline inserted between said drain and said first stripline stub.

3. A band reflection type oscillator as claimed in claim 2, further comprising a second stripline stub connected to one end of said high impedance stripline close to said drain.

4. A band reflection type oscillator as claimed in claim 1, wherein said FET is operating as a reverse channel type of FET.

* * * * *